US 8,147,011 B2

(12) United States Patent
Chen et al.

(10) Patent No.: US 8,147,011 B2
(45) Date of Patent: Apr. 3, 2012

(54) SLIDE ASSEMBLY

(75) Inventors: Ken-Ching Chen, Kaohsiung Hsien (TW); I-Ming Tseng, Kaohsiung Hsien (TW); Chun-Chiang Wang, Kaohsiung Hsien (TW)

(73) Assignee: King Slide Works Co., Ltd., Kaosiung Hsien (TW)

( * ) Notice: Subject to any disclaimer, the term of this patent is extended or adjusted under 35 U.S.C. 154(b) by 100 days.

(21) Appl. No.: 12/631,155

(22) Filed: Dec. 4, 2009

(65) Prior Publication Data

US 2011/0135224 A1  Jun. 9, 2011

(51) Int. Cl.
*A47B 95/00* (2006.01)

(52) U.S. Cl. .................... 312/333; 312/334.44

(58) Field of Classification Search ............. 312/334.1, 312/334.7, 334.8, 334.11, 334.16, 334.17, 312/330.1, 333, 334.44, 334.46, 334.47; 384/18, 20, 21
See application file for complete search history.

(56) References Cited

U.S. PATENT DOCUMENTS

| | | | | |
|---|---|---|---|---|
| 1,557,765 A * | 10/1925 | Nicholas | 198/634 |
| 2,859,070 A * | 11/1958 | Gomersall | 384/18 |
| 2,862,772 A * | 12/1958 | Gussack | 384/19 |
| 2,864,656 A * | 12/1958 | Yorinks | 384/19 |
| 3,462,203 A * | 8/1969 | Del Vecchio | 384/19 |
| 3,778,120 A * | 12/1973 | Hagen et al. | 384/18 |
| 4,101,178 A * | 7/1978 | Adams et al. | 384/21 |
| 4,200,342 A * | 4/1980 | Fall | 384/19 |
| 4,333,690 A * | 6/1982 | Keefe et al. | 384/19 |
| 4,549,773 A * | 10/1985 | Papp et al. | 384/18 |
| 4,560,212 A * | 12/1985 | Papp et al. | 384/18 |
| 4,872,734 A * | 10/1989 | Rechberg | 312/333 |
| 4,998,828 A * | 3/1991 | Hobbs | 384/18 |
| 5,484,209 A * | 1/1996 | Weng | 384/18 |
| 5,507,571 A * | 4/1996 | Hoffman | 312/334.8 |
| 5,722,750 A * | 3/1998 | Chu | 312/334.11 |
| 5,868,479 A * | 2/1999 | Hoffman | 312/334.44 |
| 6,257,683 B1 * | 7/2001 | Yang | 312/333 |
| 6,350,001 B1 * | 2/2002 | Chu | 312/334.44 |
| 6,386,660 B1 * | 5/2002 | Yang | 312/334.46 |
| 6,390,575 B1 * | 5/2002 | Chen et al. | 312/334.46 |
| 6,402,275 B1 * | 6/2002 | Yang | 312/334.46 |
| 6,412,891 B1 * | 7/2002 | Liang et al. | 312/334.44 |
| 6,502,910 B2 * | 1/2003 | Kuo-Chan | 312/333 |
| 6,764,150 B2 * | 7/2004 | Le et al. | 312/334.46 |
| 6,830,300 B2 * | 12/2004 | Lauchner | 312/334.5 |
| 6,851,773 B2 * | 2/2005 | Chen et al. | 312/334.46 |
| 6,854,816 B2 * | 2/2005 | Milligan | 312/334.11 |
| 6,935,710 B2 * | 8/2005 | Chen et al. | 312/333 |
| 6,938,967 B2 * | 9/2005 | Dubon et al. | 312/333 |

(Continued)

*Primary Examiner* — Darnell Jayne
*Assistant Examiner* — Kimberley S Wright
(74) *Attorney, Agent, or Firm* — Rosenberg, Klein & Lee

(57) ABSTRACT

A slide assembly includes a first slide member having a guiding base and a lock portion, a second slide member having a first slide segment and a second slide segment, a third slide member movably mounted on the second slide segment, an aid-sliding member slidably connected between the first slide member and the first slide segment, and a positioning device connected to the second slide member. The positioning device includes an elastic member and a positioning member which is movable by a force of the elastic member, so that two ends of the positioning member are respectively located corresponding to the guiding base and the third slide member. The positioning member is engaged with the lock portion when the second slide member is moved relative to the first slide member, and is disengaged from the lock portion when the third slide member is retracted relative to the second slide member.

15 Claims, 10 Drawing Sheets

U.S. PATENT DOCUMENTS

| | | | |
|---|---|---|---|
| 6,942,307 B1 * | 9/2005 | Lammens | 312/334.46 |
| 6,945,619 B1 * | 9/2005 | Chen et al. | 312/334.47 |
| 6,988,626 B2 * | 1/2006 | Varghese et al. | 211/26 |
| 7,090,319 B2 * | 8/2006 | Milligan et al. | 312/334.46 |
| 7,118,277 B2 * | 10/2006 | Chen et al. | 384/21 |
| 7,255,409 B2 * | 8/2007 | Hu et al. | 312/334.4 |
| 7,357,468 B2 * | 4/2008 | Hwang et al. | 312/333 |
| 7,441,848 B2 * | 10/2008 | Chen et al. | 312/333 |
| 7,467,833 B2 * | 12/2008 | Weng | 312/221 |
| 7,794,030 B2 * | 9/2010 | Peng et al. | 312/334.46 |
| 2001/0040203 A1 * | 11/2001 | Brock et al. | 248/222.11 |
| 2002/0089273 A1 * | 7/2002 | Weng | 312/334.1 |
| 2004/0207301 A1 * | 10/2004 | Chen et al. | 312/333 |
| 2005/0017614 A1 * | 1/2005 | Cirocco et al. | 312/333 |
| 2005/0116594 A1 * | 6/2005 | Barry et al. | 312/334.4 |
| 2006/0120636 A1 * | 6/2006 | Chen et al. | 384/18 |
| 2007/0040485 A1 * | 2/2007 | Tseng et al. | 312/333 |

* cited by examiner

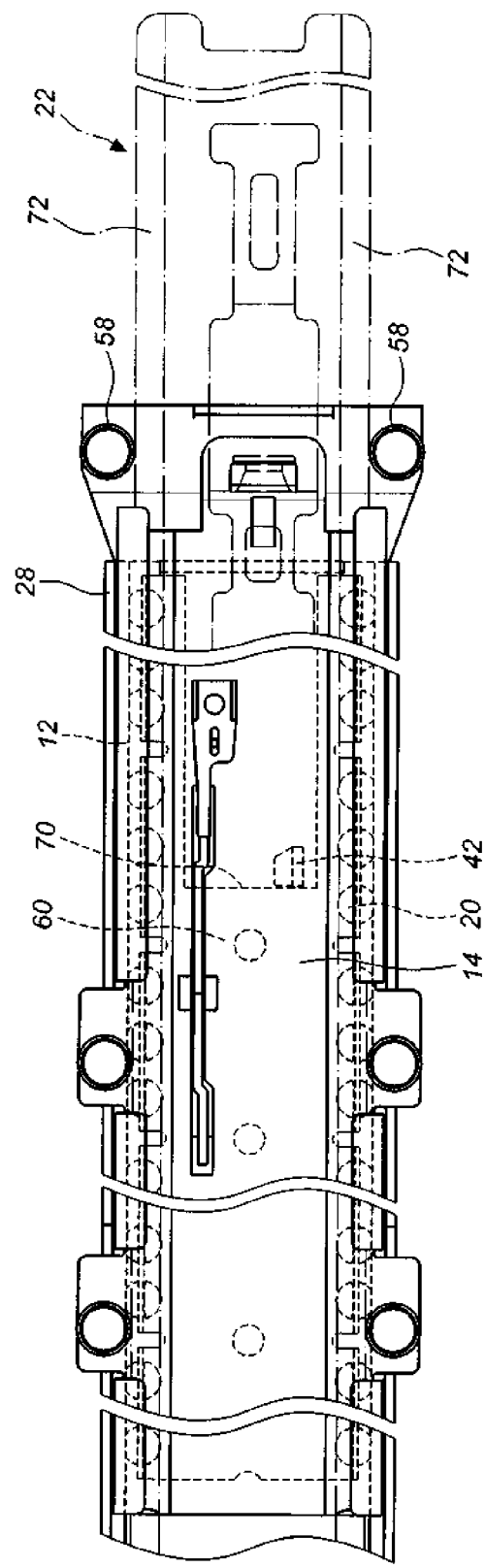

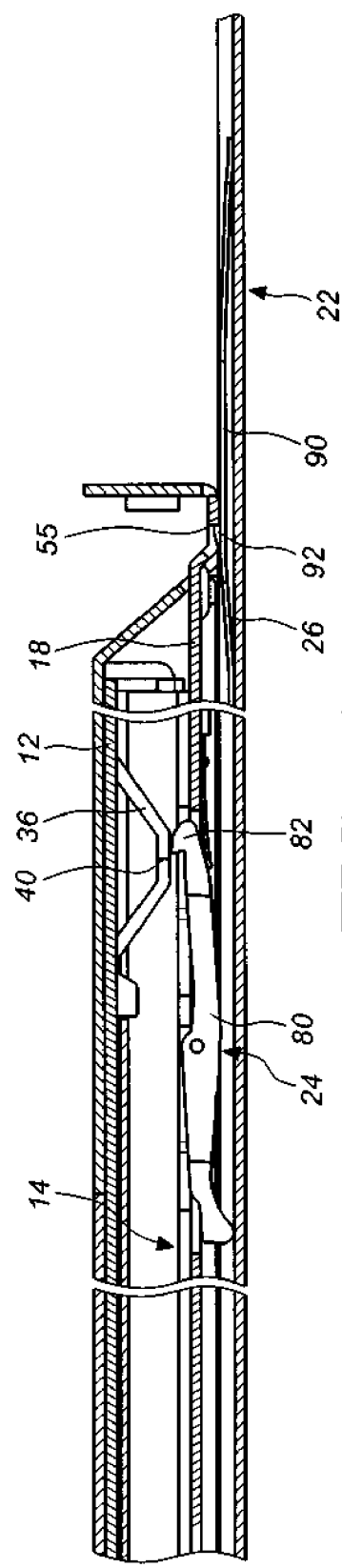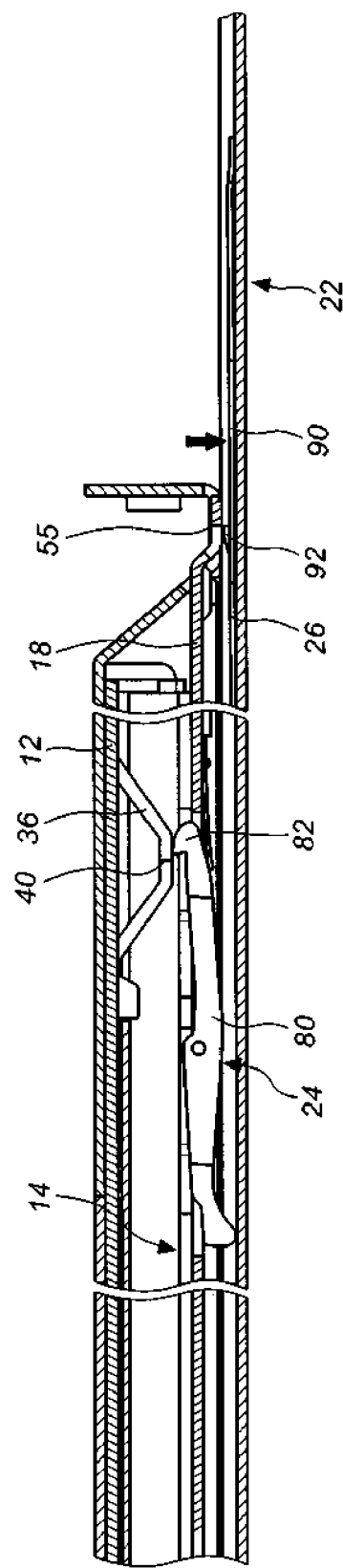

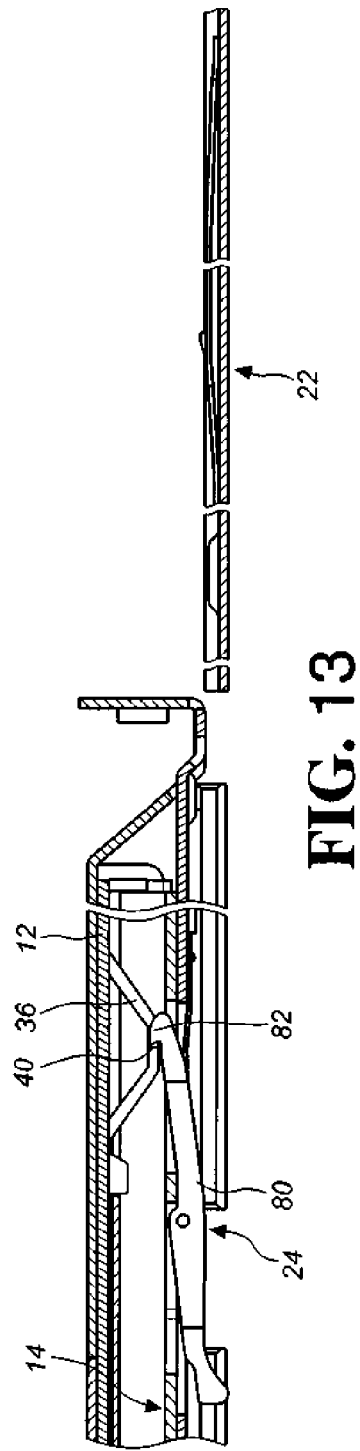
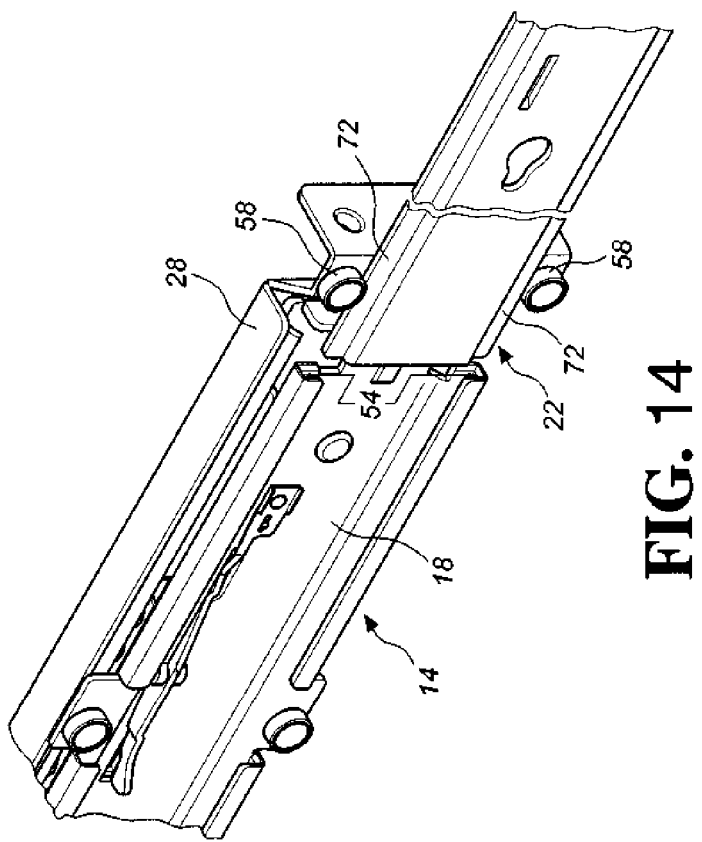

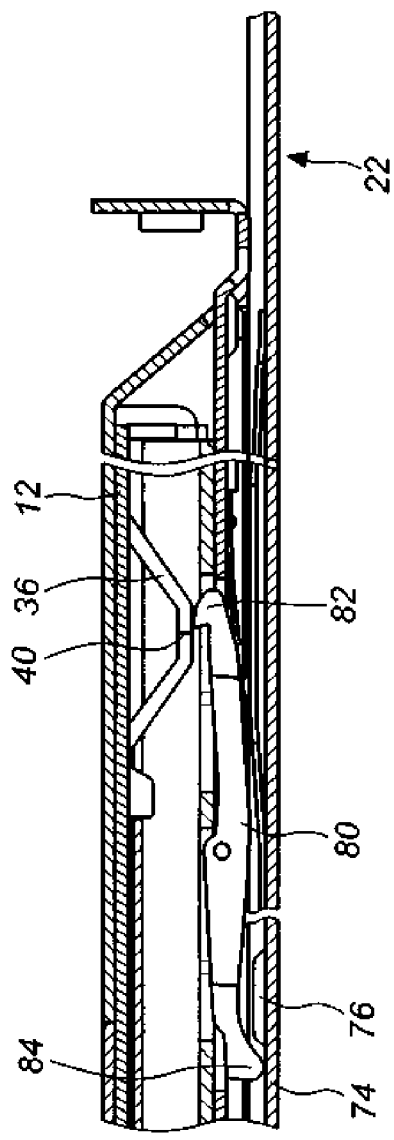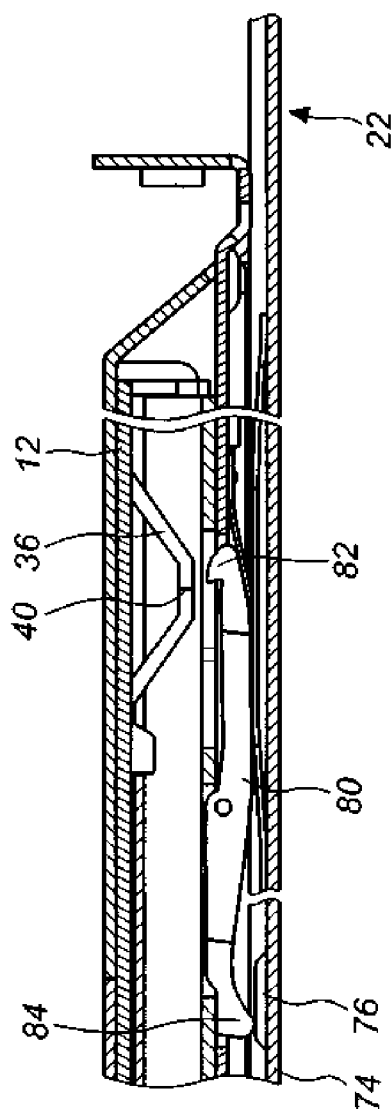

SLIDE ASSEMBLY

FIELD OF THE INVENTION

The present invention relates to a slide assembly, and more particularly, to a slide assembly including a third slide member which has a thin profile and a second slide member that supports the third slide member and can be automatically positioned to allow the third slide member to be installed to the slide assembly after being removed.

BACKGROUND OF THE INVENTION

A conventional slide assembly generally includes a fixed rail, a support rail, a movable rail, a first aid-sliding member connected between the fixed rail and the support rail, and a second aid-sliding member connected between the support rail and the movable rail so that the support rail is movable relative to the fixed rail and the movable rail is movable relative to the support rail. The first and second aid-sliding members use balls as a medium for rolling. When the conventional slide assembly is used on a server frame, a pair of fixed rails is installed to posts on two sides of the rack and a pair of movable rails is installed to two sides of the chassis. A pair of support rails is respectively and movably connected between the fixed rails and the movable rails. The support rails are not removable and the movable rails are designed to be removed from the support rails, such that the chassis that is connected with the movable rails can be removed or pulled out relative to the rack for maintenance purposes.

The movable rails are directly connected to the balls of the second aid-sliding member. However, the movable and support rails must have grooves for accommodation of the balls. The movable and the support rails cannot be shaped in a thin type, and it is difficult to install them in the small gap between the chassis and the posts of the rack.

The gap has to be minimized due to the consideration of maximization of the chassis between the posts of the rack. Therefore, if the movable rails and the support rails are not thin enough, they are not able to be installed to the rack. Especially for those movable rails having grooves for the balls, the movable rails usually extend out from the posts of the rack from the gap when the chassis is pulled out, so that the thickness of the movable rails cannot larger than the gap.

Besides, when the chassis is installed to the rack, the movable rails on two sides of the chassis are arranged to be correspondent to the support rails and the balls of the second aid-sliding member are installed between the support and movable rails. Therefore, the balls of the second aid-sliding member are designed to be maintained at a pre-set position relative to the movable rail and cannot move randomly. When the movable rail is connected with the balls of the second aid-sliding member to install the chassis into the rack, the balls of the second aid-sliding member are moved together with the chassis being pushed into the rack.

Accordingly, if the balls of the second aid-sliding member between the movable rails and the support rails are not existed, the movable rail and the support rail can be easily made thin and the movable rail does not need to precisely connected with the balls of the aid-sliding members, such that the chassis can be easily removed from or installed to the rack.

SUMMARY OF THE INVENTION

The present invention relates to a slide assembly comprising a first slide member having two lips and a connecting portion connected between the two lips. A first passage is defined between the two lips and the connecting portion. Two stop walls extend from two ends of the connecting portion so as to define a boundary of the first passage. A second slide member includes a first slide segment and a second slide segment which is connected to the first slide segment back to back. The first slide segment has two first marginal walls and a first side wall is connected between the two first marginal walls. The second slide segment has a top wall, a bottom wall and a second side wall which is connected between the top wall and the bottom wall. A second passage is defined among the top wall, the bottom wall and the second side wall. An aid-sliding member includes a bearing retainer and a plurality of balls. The bearing retainer has a first bearing retaining portion, a second bearing retaining portion and a connection wall which is connected between the first and second bearing retaining portions. The balls are movably connected with the first and second bearing retaining portions, and located between the lips of the first slide member and the first marginal walls of the first slide segment of the second slide member. A third slide member includes two longitudinal sections, and a side board having two transverse sections connected to the longitudinal sections. The longitudinal sections are movably engaged in the second passage of the second slide segment of the second slide member. The stop walls of the first slide member restrict the aid-sliding member and the second slide member to be movable in the first passage of the first slide member.

The aid-sliding member and the slide member are set at a pre-set position when the slide member is pulled out, and the pre-set position is released when the slide member is disengaged from the slide assembly and re-installed to the slide assembly.

The present invention provides another slide assembly which comprises a first slide member having two lips, a connecting portion connected between the two lips, and a guiding base connected to the connecting portion. The guiding base includes a lock portion. A second slide member has a slot, a first slide segment and a second slide segment. An aid-sliding member is slidably connected between the first slide member and the first slide segment of the second slide member. A positioning device includes an elastic member connected to the second slide member and a positioning member pivotably connected to the second slide member. The positioning member includes a first end and a second end located opposite to the first end. The first end of the positioning member is located corresponding to the slot of the second slide member. By the elasticity of the elastic member, the first end of the positioning member is urged to extend into the slot of the second slide member and correspond in position to the guiding base of the first slide member, And the second end of the positioning member is located corresponding to the third slide member. The first end of the positioning member of the positioning device engages with the lock portion of the guiding base when the second slide member is pulled out relative to the first slide member so as to form a locked status. The second end of the positioning member of the positioning device contacts the third slide member when the third slide member is retracted relative to the second slide member. The first end of the positioning member is disengaged from the lock portion of the guiding base.

The present invention further provides an engaging member which includes a first end, a second end, and an operation plate connected between the first and second ends of the engaging member. The first end of the engaging member contacts the third slide member, and the second end of the engaging member is fixed to the third slide member. The second slide segment of the second slide member includes an engaging portion which can be engaged with the stop piece and a space is defined between the operation plate and the third slide member, so that the operation plate can be pressed to allow the stop piece to be released from the engaging portion of the second slide segment.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 10 shows that the third slide member is pulled relative to the second slide member and positioned;

FIG. 11 shows the positioning member is located relative to the guiding base;

FIG. 12 shows that a force is applied to the engaging member to disengage the third and second slide members;

FIG. 13 shows that the third slide member is separated from the second slide member;

FIG. 14 shows that the third slide member is connected to the second slide member again;

FIG. 15 shows that the third slide member contacts the positioning member; and

FIG. 16 shows that the positioning member is released when the protrusion of the third slide member contacts the positioning member.

DETAILED DESCRIPTION OF THE PREFERRED EMBODIMENT

Figure 1:
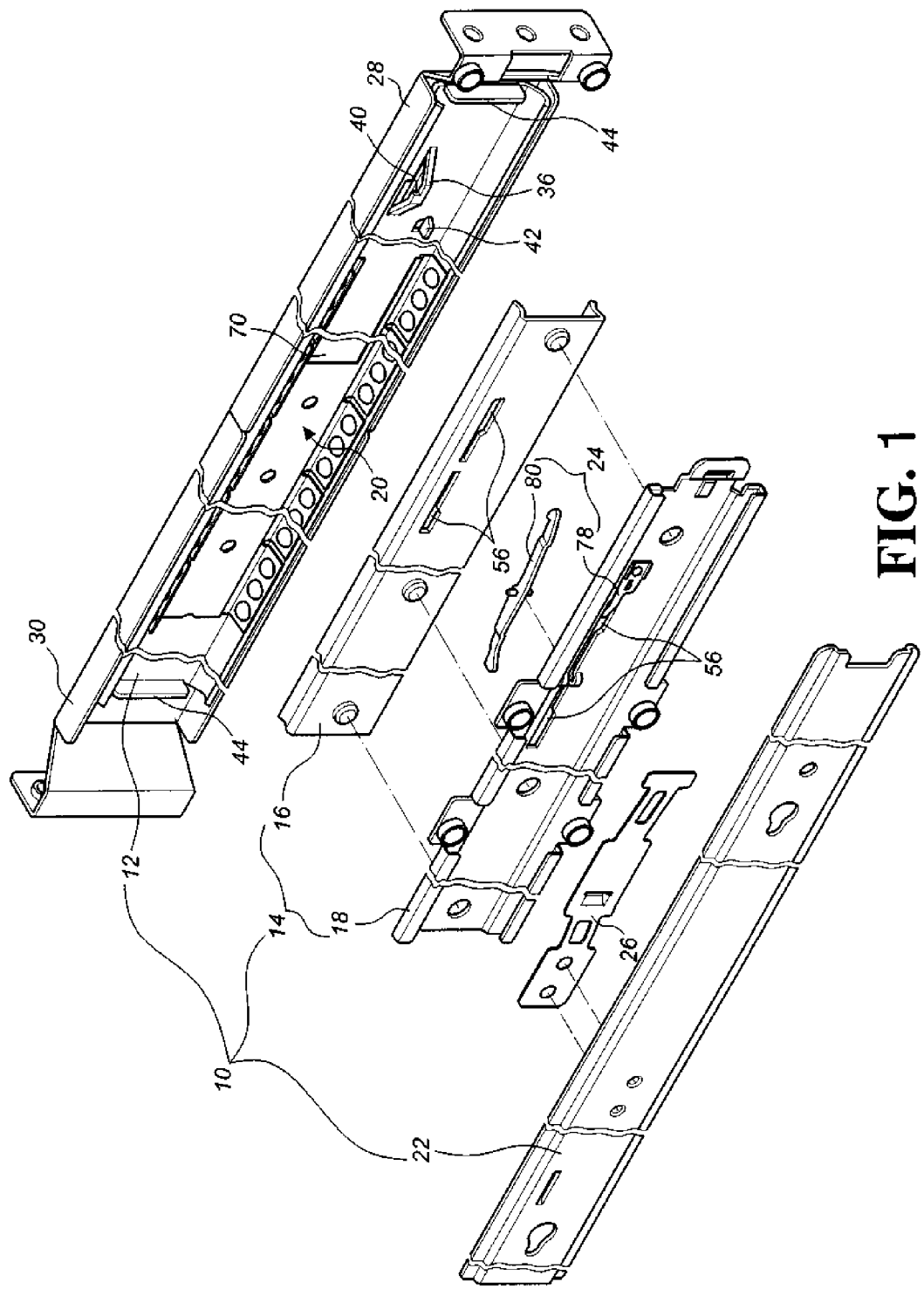
FIG. 1 is an exploded view to show the slide assembly of the present invention.

Referring to FIG. 1 which shows the slide assembly 10 of the present invention and comprises a first slide member 12, a second slide member 14 which includes a first slide segment 16 and a second slide segment 18 which is connected to the first slide segment 16 back to back. An aid-sliding member 20 is slidably connected between the first slide member 12 and the first slide segment 16 of the second slide member 14 so that the second slide member 14 is easily moved relative to the first slide member 12. A third slide member 22 is movably connected to the second slide segment 18 of the second slide member 14. A positioning device 24 is connected to the second slide member 14 and located relative to the first slide member 12. An engaging member 26 is connected to the third slide member 22. A front support 28 and a rear support 30 are longitudinally connected to the first slide member 12.

Figure 2:
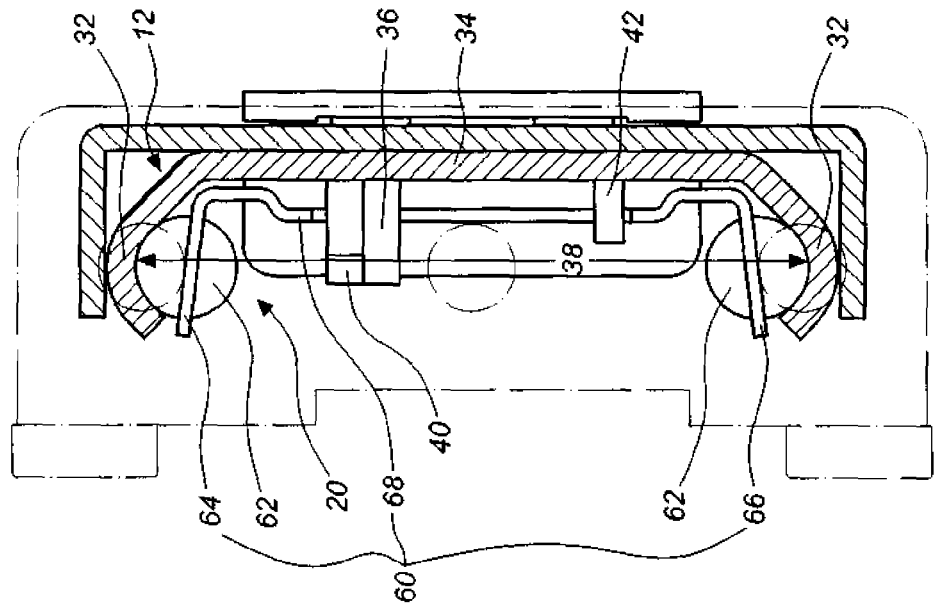
FIG. 2 is a cross sectional view to show the first slide member and the front support of the slide assembly of the present invention.

As shown in FIG. 2, the first slide member 12 includes two lips 32 and a connecting portion 34 connected between the two lips 32. A guiding base 36 is connected to the connecting portion 34. A first passage 38 is defined between the two lips 32 and the connecting portion 34. The guiding base 36 includes a lock portion 40. In this embodiment, the guiding base 36 extends from the connecting portion 34 by way of pressing extension. The connecting portion 34 further includes a stop portion 42 and two stop walls 44 which extend from two ends of the connecting portion 34 so as to define a boundary of the first passage 38.

Figure 4:
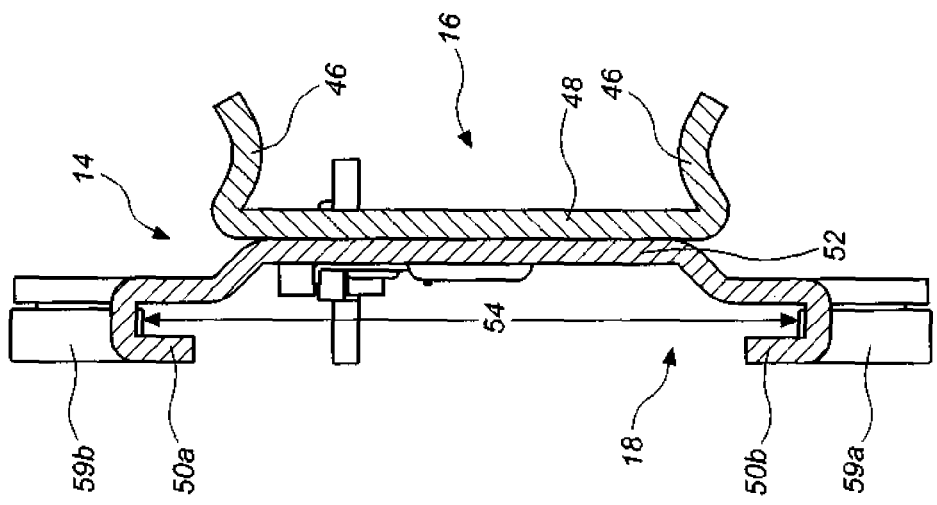
FIG. 4 is a side cross sectional view to show the second slide member.
Figure 3:
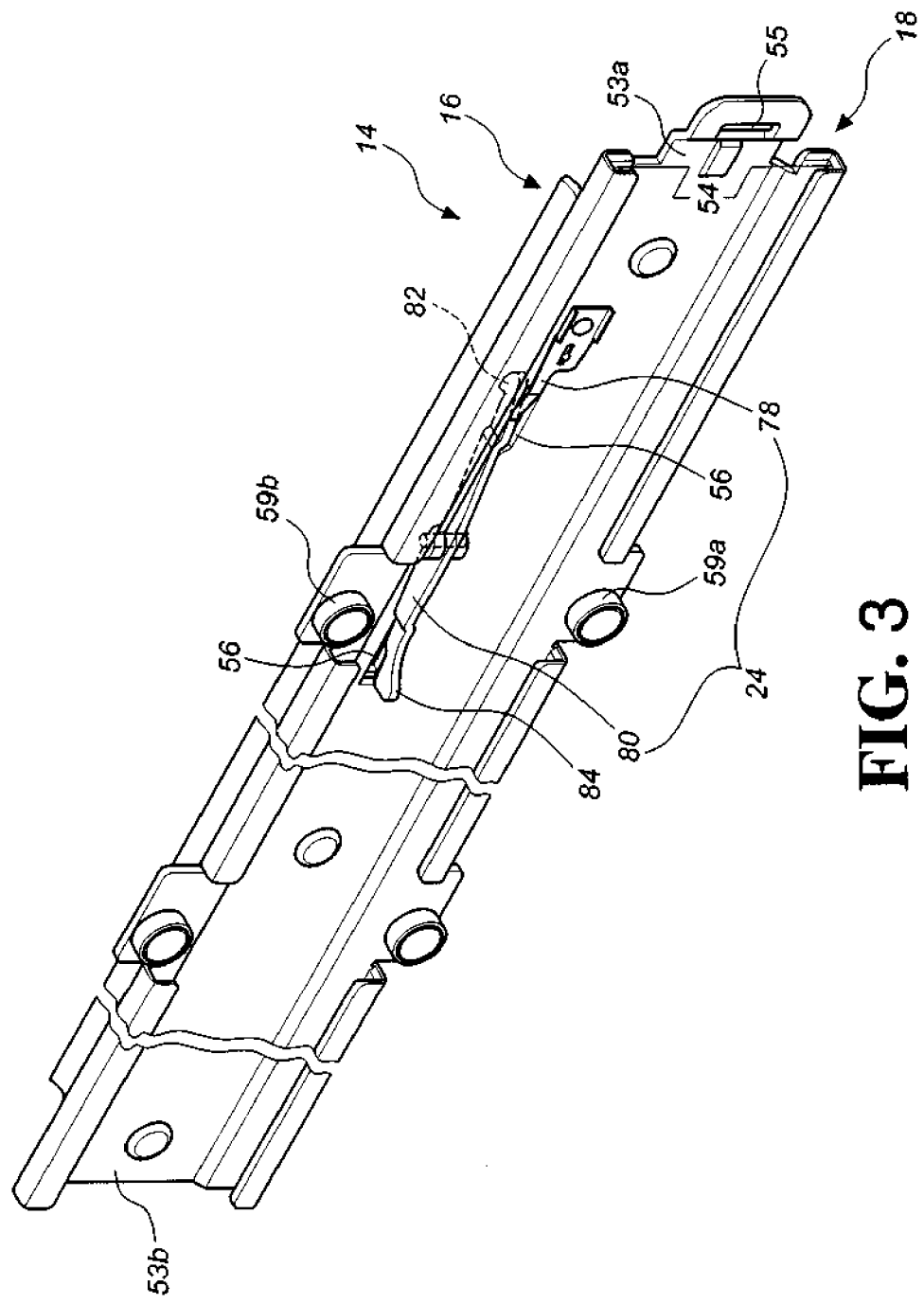
FIG. 3 is a perspective view to show the second slide member and the positioning device of the present invention.
Figure 7:
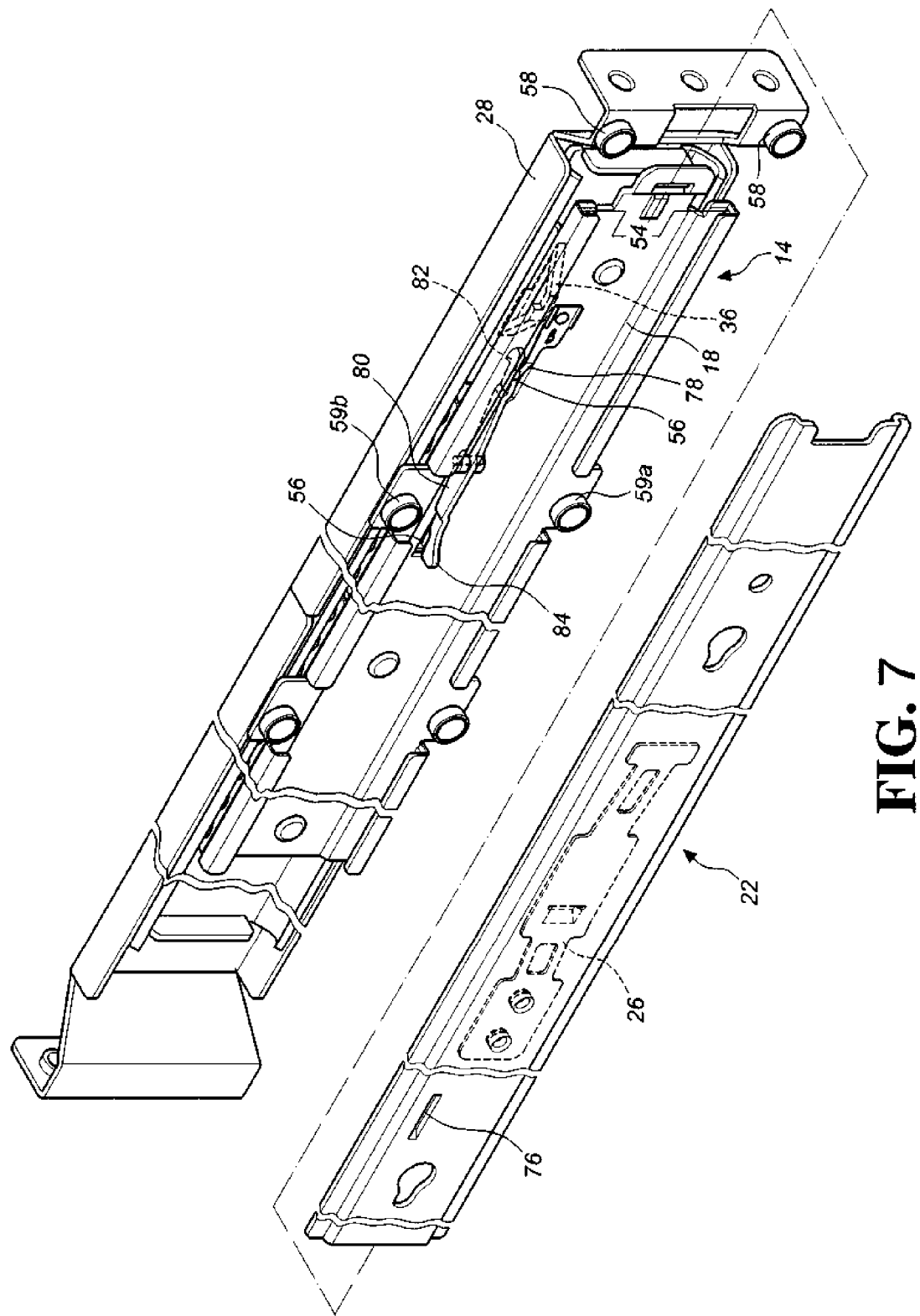
FIG. 7 is an exploded view to show the second slide member and the third slide member of the present invention.

Referring to FIGS. 3 and 4, the first slide segment 16 includes two first marginal walls 46 and a first side wall 48 which is connected between the two first marginal walls 46. The second slide segment 18 includes a top wall 50a, a bottom wall 50b and a second side wall 52 connected between the top wall 50a and the bottom wall 50b. A second passage 54 is defined among the top wall 50a, the bottom wall 50b and the second side wall 52. The first and second side walls 48, 52 are fixed to each other and include a communication slot 56 as shown in FIG. 1. The second side wall 52 includes a first end 53a and a second end 53b located opposite to the first end 53a. The first end 53a includes an engaging portion 55. In this embodiment, two support rollers 58 are connected to a front end of the front support 28 and located corresponding to the second slide segment 18 of the second slide member 14, and rolling surfaces of the support rollers 58 are located corresponding to upper and lower sides of the second passage 54, as shown in FIG. 7. A first roller 59a is connected to the second slide segment 18 of the second slide member 14 and a rolling surface of the first roller 59a is located corresponding to the lower side of the second passage 54. Alternatively, a second roller 59b is connected to the second slide segment 18 of the second slide member 14, and a rolling surface of the second roller 59b is located corresponding to the upper side of the second passage 54, The aid-sliding member 20, as shown in FIG. 2, includes a bearing retainer 60 and a plurality of balls 62. The bearing retainer 60 includes a first bearing retaining portion 64, a second bearing retaining portion 66 and a connection wall 68 connected between the first and second bearing retaining portions 64, 66. The balls 62 are movably connected with the first and second bearing retaining portions 64, 66, and located between the lips 32 of the first slide member 12 and the first marginal walls 46 of the first slide segment 16 of the second slide member 14, as shown in FIG. 4. Therefore, the aid-sliding member 20 helps the second slide member 14 to easily move relative to the first slide member 12. The stop walls 44 of the first slide member 12 restrict the travel of the second slide member 14 when the second slide member 14 moves in the first passage 38 in the first slide member 12 by the aid-sliding member 20. In this embodiment, a notch 70 is formed at an end of the connection wall 68 of the bearing retainer 60 and located corresponding to the guiding base 36 of the first slide member 12 so that the guiding base 36 is exposed and faces the second slide member 14. The stop portion 42 of the first slide member 12 is located corresponding to the notch 70 and the connection wall 68 of the bearing retainer 60 contacts the stop portion 42, such that the aid-sliding member 20 is restricted when moving relative to the first slide member 12.

Figure 6:
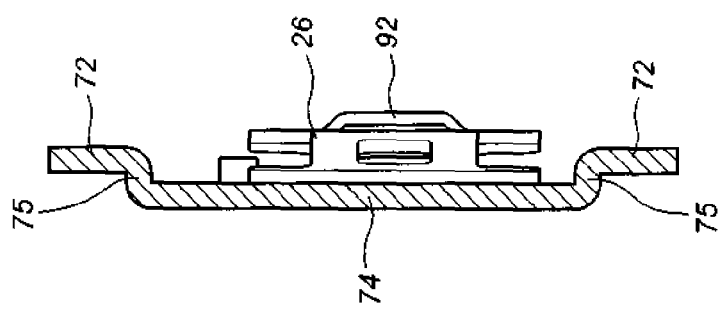
FIG. 6 is a side cross sectional view to show the third slide member and the engaging member of the present invention.
Figure 5:
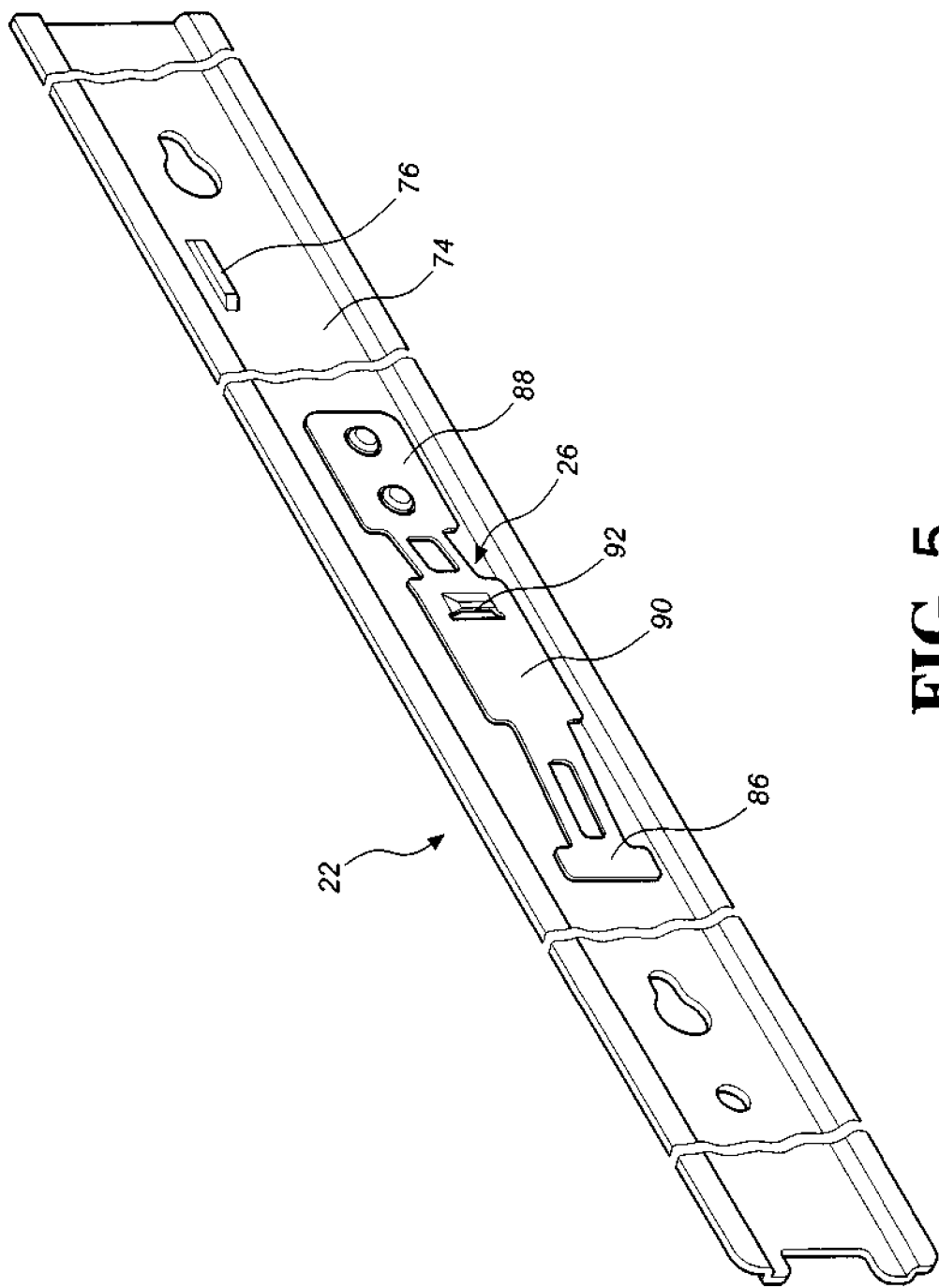
FIG. 5 is a perspective view to show the third slide member and the engaging member of the present invention.

Referring to FIGS. 5 and 6, the third slide member 22 includes two longitudinal sections 72, a side board 74 having two transverse sections 75 connected to the longitudinal sections 72, and a protrusion 76 which is located on the side board 74. The longitudinal sections 72 are movably engaged in the second passage 54 of the second slide segment 18 of the second slide member 14. In this embodiment, the protrusion 76 extends from the side board 74 and is made by way of pressing extension. The longitudinal section 72 contacts between the first and second rollers 59a, 59b of the second slide segment 18 of the second slide member 14 to provide smooth support function.

Referring to FIG. 3, the positioning device 24 includes an elastic member 78 and a positioning member 80 which is pivotably connected to the second slide member 14. One end of the elastic member 78 is fixed to the second slide segment 18 of the second slide member 14 and the other end of the elastic member 78 leans against the positioning member 80. The positioning member 80 has a first end 82 and a second end 84 located opposite to the first end 82. The first and second ends 82, 84 are located corresponding to the slot 56 of the second slide member 14. By the elasticity of the elastic member 78, the first end 82 of the positioning member 80 is urged to extend into the slot 56 of the second slide member 14 and correspond in position to the guiding base 36 of the first slide member 12, as shown in FIG. 7. The second end 84 of the positioning member 80 extends out from the slot 56 and is located corresponding to the third slide member 22. In this embodiment, the elastic member 78 is fixed to the second slide member 14 and one end of the elastic member 78 presses on the first end 82 of the positioning member 80 to maintain the first end 82 of the positioning member 80 to be inserted into the slot 56 by the force of the elastic member 78. The second end 84 of the positioning member 80 protrudes out relative to the slot 56 of the second slide member 14. Preferably, the second end 84 of the positioning member 80 is located corresponding to the protrusion 76 of the third slide member 22.

Referring to FIG. 5, the engaging member 26 includes a first end 86, a second end 88, an operation plate 90 connected between the first and second ends 86, 88 of the engaging member 26, and a stop piece 92 disposed on the operation plate 90. The first end 86 of the engaging member 26 is movable to lean against the side board 74 of the third slide member 22. The second end 88 of the engaging member 26 is fixed to the side board 74 of the third slide member 22. A space is defined between the operation plate 90 and the side board 74 of the third slide member 22 so that a user can press the operation plate 90. The stop piece 92 corresponds in position to the engaging portion 55 of the second slide segment 18 of the second slide member 14 for engaging with the engaging portion 55.

Figure 8:
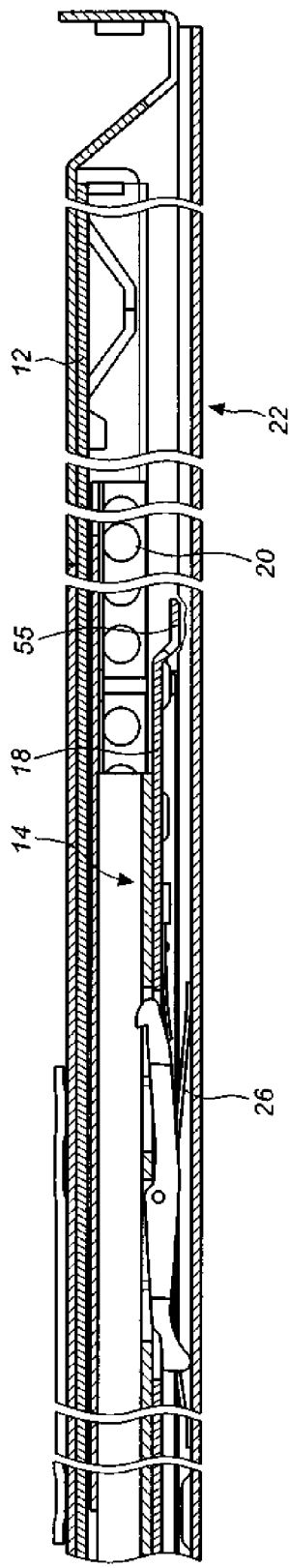
FIG. 8 shows that the second and third slide members are retracted relative to the first slide member.
Figure 9:
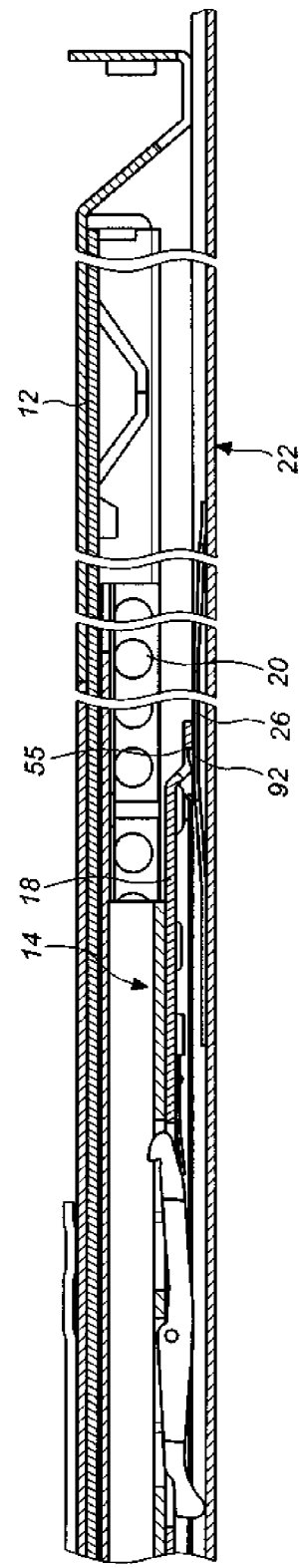
FIG. 9 shows that the third slide member is connected to the second slide member and pulled.

When pulling the third slide member 22, the third slide member 22 slides a distance from the initial retracted position, as shown in FIG. 8, and the stop piece 92 of the engaging member 26 is engaged with the engaging portion 55 of the second slide segment 18, so that the second slide member 14 is pulled out by the third slide member 22. As shown in FIG. 9, the aid-sliding member 20 is also moved together with the movement of the second slide member 14 until the notch 70 of the bearing retainer 60 of the aid-sliding member 20 reaches the stop portion 42 of the first slide member 12 to stop as shown in FIG. 10. In the meanwhile, the longitudinal sections 72 of the third slide member 22 contact the support rollers 58 of the front support 28 and the third slide member 22 is supported. As shown in FIG. 11, the first end 82 of the positioning member 80 is located corresponding to the guiding base 36. And then, as shown in FIG. 12, the operation plate 90 of the engaging member 26 is pressed by the user to let the stop piece 92 of the engaging member 26 be disengaged from the engaging portion 55 of the second slide segment 18. The third slide member 22 is then able to be separated from the second slide member 14. When the third slide member 22 is separated from the positioning member 80 of the positioning device 24, as shown in FIG. 13, the first end 82 of the positioning member 80 engages with the lock portion 40 of the guiding base 36, such that the second slide member 14 is fixed relative to the first slide member 12 by the positioning device 24.

When retracting, as shown in FIG. 14, the longitudinal sections 72 of the third slide member 22, relative to the support rollers 58 of the front support 28, are inserted into the second passage 54 of the second slide segment 18 of the second slide member 14. As shown in FIG. 15, the second end 84 of the positioning member 80 of the positioning device 24 are contact with the side board 74 of the third slide member 22 first to lift the first end 82 of the positioning member 80, so that the first end 82 of the positioning member 80 can be released from the lock portion 40 of the guiding base 36. If the first end 82 of the positioning member 80 is not completely released from the lock portion 40 of the guiding base 36, the protrusion 76 of the side board 74 is adapted to press the second end 84 so as to ensure that the positioning member 80 can be disengaged from the guiding base 36, as shown in FIG. 16. And then, along with the retraction of the third slide member 22, the second slide member 14 is retracted relative to the first slide member 12 by the movement of the third slide member 22.

As mentioned above, the slide assembly of the present invention can be used for the server racks, furniture cabinets, or retractable items. For example, the front and rear supports of the first slide member are fixed to a rack, cabinet or fixed object, the third slide member is fixed to a chassis, drawer or movable object. By this arrangement, the chassis, drawer or movable object can be pulled out or retracted relative to the rack, cabinet or fixed object. Especially, when cooperating with the rack of standard specification, the third slide member 22 is shaped in a thin type so that it can be installed into a small gap between the chassis and the rack. Besides, when the third slide member 22 is pulled relative to the second slide member 14, the first roller 59a assists the movement and support of the third slide member 22. When the third slide member 22 is separated from the second slide member 14 and the user wants to assemble them again, the support rollers 58 guide the third slide member 22 to easily combine with the second slide member 14, and assist the movement of the third slide member 22.

As for the positioning device, when the third slide member is separated from the second slide member, the second slide member is maintained at a pre-set position relative to the first slide member. When the positioning device responds to that the third slide member is retracted relative to the second slide member, the second slide member moves from the pre-set position and provides a continuous slidable support to the first, second and third slide members to ensure the slidable support is provided by the slide assembly of the present invention.

While we have shown and described the embodiment in accordance with the present invention, it should be clear to those skilled in the art that further embodiments may be made without departing from the scope of the present invention.

What is claimed is:
1. A slide assembly, comprising:
a first slide member having two lips, a connecting portion connected between the two lips, a first passage defined between the two lips and the connecting portion, two stop walls extending from two ends of the connecting portion so as to define a boundary of the first passage;
a front support longitudinally connected to the first slide member;

a second slide member including a first slide segment and a second slide segment connected to the first slide segment back to back, the first slide segment having two first marginal walls and a first side wall connected between the two first marginal walls, the second slide segment having a top wall, a bottom wall and a second side wall connected between the top wall and the bottom wall, a second passage defined among the top wall, the bottom wall and the second side wall;

an aid-sliding member including a bearing retainer and a plurality of balls, the bearing retainer having a first bearing retaining portion, a second bearing retaining portion and a connection wall connected between the first and second bearing retaining portions, the balls movably connected with the first and second bearing retaining portions, the balls located between the lips of the first slide member and the first marginal walls of the first slide segment of the second slide member; and a third slide member having two longitudinal sections, a side board having two transverse sections connected to the longitudinal sections, the longitudinal sections movably engaged in the second passage of the second slide segment of the second slide member, the third slide member being detachable from the second slide member, the second slide member being releasably locked against longitudinal retraction relative to the first slide member responsive to detachment of the third slide member therefrom; and wherein the stop walls of the first slide member restrict the aid-sliding member and the second slide member to be movable in the first passage of the first slide member.

2. The slide assembly as claimed in claim 1, further comprising an elastic member connected to the second slide member and a positioning member pivotably connected to the second slide member, wherein the first slide member includes a guiding base which has a lock portion, the positioning member has a first end and a second end located opposite to the first end, the positioning member responds to a force of the elastic member to set the first end of the positioning member to be located corresponding to the guiding base and movably contacts the lock portion along with the second slide member being pulled out relative to the first slide member, the second end of the positioning member is located corresponding to the third slide member and contacts the third slide member when the third slide member is retracted relative to the second slide member, so that the first end of the positioning member is disengaged from the lock portion.

3. The slide assembly as claimed in claim 2, wherein the third slide member includes a protrusion which is located corresponding to the second end of the positioning member.

4. The slide assembly as claimed in claim 1, further comprising two support rollers located at a front end of the front support and located corresponding to the second slide segment of the second slide member, rolling surfaces of the two support rollers are located corresponding to upper and lower sides of the second passage.

5. The slide assembly as claimed in claim 1, further comprising at least one first roller connected to the second slide segment of the second slide member, wherein a rolling surface of the first roller is located corresponding to a lower side of the second passage.

6. The slide assembly as claimed in claim 5, further comprising a second roller connected to the second slide segment of the second slide member, wherein a roller surface of the second roller is located corresponding to an upper side of the second passage.

7. A slide assembly, comprising:
a first slide member having two lips, a connecting portion connected between the two lips, and a guiding base connected to the connecting portion, the guiding base including a lock portion;
a second slide member having a slot, a first slide segment and a second slide segment;
an aid-sliding member slidably connected between the first slide member and the first slide segment of the second slide member;
a third slide member movably connected to the second slide segment of the second slide member, the third slide member being detachable from the second slide member, the second slide member being releasably locked against longitudinal retraction relative to the first slide member responsive to detachment of the third slide member therefrom; and
a positioning device including an elastic member connected to the second slide member and a positioning member pivotably connected to the second slide member, the positioning member including a first end and a second end located opposite to the first end, the first end of the positioning member located corresponding to the slot of the second slide member, by the elasticity of the elastic member, the first end of the positioning member being urged to extend into the slot of the second slide member and correspond in position to the guiding base of the first slide member, and the second end of the positioning member being located corresponding to the third slide member;
wherein the first end of the positioning member of the positioning device engages with the lock portion of the guiding base when the second slide member is pulled out relative to the first slide member so as to form a locked status;
wherein the second end of the positioning member of the positioning device is contact with the third slide member when the third slide member is retracted relative to the second slide member, the first end of the positioning member is disengaged from the lock portion of the guiding base.

8. The slide assembly as claimed in claim 7, wherein the third slide member includes a protrusion which is located corresponding to the second end of the positioning member.

9. The slide assembly as claimed in claim 7, wherein the first slide segment of the second slide member includes two first marginal walls and a first side wall connected between the two first marginal walls, the second slide segment includes a top wall, a bottom wall and a second side wall connected between the top wall and the bottom wall, the first side wall and the second side wall are fixed to each other.

10. The slide assembly as claimed in claim 7, wherein the aid-sliding member includes a bearing retainer and a plurality of balls, the bearing retainer has a first bearing retaining portion, a second bearing retaining portion and a connection wall connected between the first and second bearing retaining portions, the balls are movably engaged with the first and second bearing retaining portions, a notch is defined in an end of the connection wall of the bearing retainer and located corresponding to the guiding base of the first slide member so that the guiding base is located corresponding to the second slide member, the first slide member has a stop portion which is located corresponding to the connection wall of the bearing retainer.

11. The slide assembly as claimed in claim 7, further comprising an engaging member which includes a first end, a second end, an operation plate connected between the first and second ends of the engaging member, and a stop piece disposed on the operation plate, the first end of the engaging member contacts the third slide member, the second end of the engaging member is fixed to the third slide member, the second slide segment of the second slide member includes an engaging portion which can be engaged with the stop piece and a space is defined between the operation plate and the third slide member.

12. The slide assembly as claimed in claim 1, wherein the third slide member is releasably locked against detachment from the second slide member by an engaging member, the engaging member being deflectable to permit detachment of the third slide member from the second slide member, the engaging member actuating release of the second slide member for longitudinal retraction relative to the first slide member responsive to re-attachment of the third slide member to the second slide member.

13. The slide assembly as claimed in claim 7, wherein the third slide member is releasably locked against detachment from the second slide member by an engaging member, the engaging member being deflectable to permit detachment of the third slide member from the second slide member, the engaging member actuating release of the second slide member for longitudinal retraction relative to the first slide member responsive to re-attachment of the third slide member to the second slide member.

14. The slide assembly as claimed in claim 4, further comprising at least one first roller connected to the second slide segment of the second slide member, wherein a rolling surface of the first roller is located corresponding to a lower side of the second passage.

15. The slide assembly as claimed in claim 14, further comprising a second roller connected to the second slide segment of the second slide member, wherein a roller surface of the second roller is located corresponding to an upper side of the second passage.

* * * * *